United States Patent
Menard et al.

(10) Patent No.: US 7,259,407 B2
(45) Date of Patent: Aug. 21, 2007

(54) ISOLATED HF-CONTROL SCR SWITCH

(75) Inventors: Samuel Menard, Tours (FR);
Christophe Mauriac, Fondettes (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/963,383

(22) Filed: Oct. 12, 2004

(65) Prior Publication Data

US 2005/0082565 A1 Apr. 21, 2005

(30) Foreign Application Priority Data

Oct. 17, 2003 (FR) .................................. 03 50702

(51) Int. Cl.
*H01L 29/74* (2006.01)
(52) U.S. Cl. ............... 257/107; 257/115; 257/157; 327/428; 327/438; 327/439; 327/445; 327/453; 327/455; 327/475; 327/476; 327/460
(58) Field of Classification Search ............... 257/119, 257/157; 327/428, 439, 445, 453, 455, 476; 357/53, 38, 35, 43, 51
See application file for complete search history.

(56) References Cited

U.S. PATENT DOCUMENTS

| | | | |
|---|---|---|---|
| 4,389,691 A | 6/1983 | Hancock | |
| 4,649,414 A * | 3/1987 | Ueda et al. | 257/137 |
| 4,760,432 A | 7/1988 | Stoisiek et al. | |
| 4,982,259 A | 1/1991 | Yakushiji et al. | |
| 5,959,440 A * | 9/1999 | Tobita et al. | 323/237 |
| 6,326,648 B1 * | 12/2001 | Jalade et al. | 257/130 |

OTHER PUBLICATIONS

French Search Report from corresponding French National Application No. 03/50702, filed Oct. 17, 2003.

* cited by examiner

*Primary Examiner*—Evan Pert
*Assistant Examiner*—Tan Tran
(74) *Attorney, Agent, or Firm*—Lisa K. Jorgenson; James H. Morris; Wolf, Greenfield & Sacks, P.C.

(57) ABSTRACT

A vertical SCR switch to be controlled by a high-frequency signal having at least four main alternated layers. The switch includes a gate terminal and a gate reference terminal connected via integrated capacitors to corresponding areas. In the case of a thyristor, having on its front surface side a main P-type semiconductor area formed in an N-type gate semiconductor area, a first portion of the main area being connected to one of the main areas, a second portion of the main area is connected to one of the control terminals via a first integrated capacitor, and a portion of the gate area being connected to the other of the control terminals via a second integrated capacitor.

18 Claims, 5 Drawing Sheets

ISOLATED HF-CONTROL SCR SWITCH

BACKGROUND OF THE INVENTION

1. Field of the Invention

The present invention relates generally to vertical SCR-type switches. "SCR-type switches" is used to designate components such as thyristors, triacs, and controlled bi-directional switches of various types comprising at least four semiconductor layers of alternated doping types.

The present invention more specifically relates to the galvanic isolation of an SCR-type switch control circuit.

2. Discussion of the Related Art

The galvanic isolation between a control circuit and one or several controlled SCR-type switches is generally performed by means of a transformer or of an optocoupler. These two isolation means are generally expensive and difficult to integrate.

SUMMARY OF THE INVENTION

An object of the present invention is to provide a monolithic SCR-type switch such that the switch control circuit is galvanically isolated from the power circuit of the switch.

Another object of the present invention is to provide such a switch with a simple structure.

To achieve these and other objects, the present invention provides using a high-frequency HF controlled SCR-type switch and integrating capacitors in the structure.

More specifically, the present invention provides a vertical SCR switch capable of being controlled by a high-frequency signal, comprising at least four main layers of alternated doping types through which a large current is capable of circulating from one surface to another between two main terminals, and comprising a gate terminal connected to a gate area via a capacitor. The switch further comprises a gate reference terminal connected via an integrated capacitor to a gate reference area arranged on the same surface of the component as the gate area.

According to an embodiment of the present invention, the switch is of thyristor type, comprising on the front surface side a main semiconductor area of a first doping type formed in a gate semiconductor area of a second doping type, a first portion of the main area being connected to one of the main terminals, a second portion of the main area being connected to one of the control terminals via a first integrated capacitor, and a portion of the gate area being connected to the other one of the control terminals via a second integrated capacitor.

According to an embodiment of the present invention, the first and second portions of the main area are two separate semiconductor regions.

According to an embodiment of the present invention, the second portion of the main area and said portion of the gate area are covered with an insulating layer and with a metallization, the stacking of a semiconductor portion, of an insulating portion, and of a metallization forming said first and second capacitors.

According to an embodiment of the present invention, the second portion of the main area and said portion of the gate area are each covered with a metallization in contact with an electrode of an integrated capacitor having its other electrode in contact with a metallization connected to a main terminal or to a control terminal.

According to an embodiment of the present invention, the main area is a cathode area, the main area comprising one or several N-type semiconductor regions formed in a P-type well forming the gate area, the P-type well being formed above an N-type semiconductor layer under which is placed a P-type semiconductor region corresponding to the thyristor's anode.

According to an embodiment of the present invention, the second portion of the main area corresponding to an N-type region is placed between said first portion of the main area corresponding to an N-type region and the portion of the P-type well connected to the gate terminal.

According to an embodiment of the present invention, the first portion of the main area comprises several holes corresponding to portions of the P-type well, a metallization connected to a main terminal covering the first portion of the main area and all the holes.

According to an embodiment of the present invention, the switch is of triac type, comprising on the front surface side a main semiconductor area of a first doping type formed in a well of a second doping type, the main area and the well being connected to a main terminal, a gate region of the first doping type being formed in the well and being connected to a control terminal via a first integrated capacitor, and a portion of the well being connected to a gate reference terminal via a second integrated capacitor.

According to an embodiment of the present invention, the switch is of bi-directional type, comprising on the front surface side a main semiconductor area of a first doping type formed in a well of a second doping type, the main area and the well being connected to a main terminal, the assembly being surrounded with an insulating wall, a gate region of the first doping type being formed in the insulating wall or in a lateral prolongation thereof and being connected to a control terminal via a first integrated capacitor, and a portion of the well being connected to a gate reference terminal via a second integrated capacitor.

The foregoing objects, features, and advantages of the present invention will be discussed in detail in the following non-limiting description of specific embodiments in connection with the accompanying drawings.

DETAILED DESCRIPTION

FIGS. 2 to 6 and 8 to 11 are partial simplified views and are only intended to simplify the understanding of the following description. It will be within the abilities of those skilled in the art to form practical devices by using known techniques. Further, as usual in the representation of semiconductor components, the dimensions of the various layers and regions are not drawn to scale.

Figure 1:
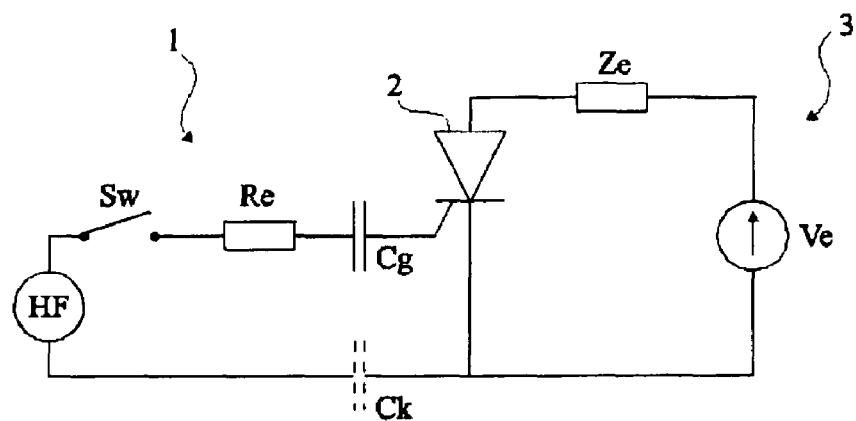
FIG. 1 is a control diagram of a thyristor belonging to a power circuit.

FIG. 1 is a diagram of a control circuit 1 of a thyristor 2 inserted in a power circuit 3. Power circuit 3 is schematically shown as a voltage generator Ve and a load Ze in series between the anode and the cathode of thyristor 2. Control circuit 1 is capable of applying a current between the gate and the cathode of the thyristor and essentially comprises, in series, a sinusoidal high-frequency generator HF, a current-limiting resistor Re, a capacitor Cg, and a switch Sw. Such a circuit (without capacitor Ck) is described in U.S. patent application Ser. No. 10/727,189, filed Dec. 3, 2003, and incorporated herein by reference. At high frequency, capacitor Cg behaves as a short-circuit and the voltage and current variations are integrally transmitted to the thyristor. This patent application explains that, even if the power provided by the control circuit at each period is smaller than the power required to start the thyristor, said thyristor starts, surprisingly, after a number of periods.

Figure 2:
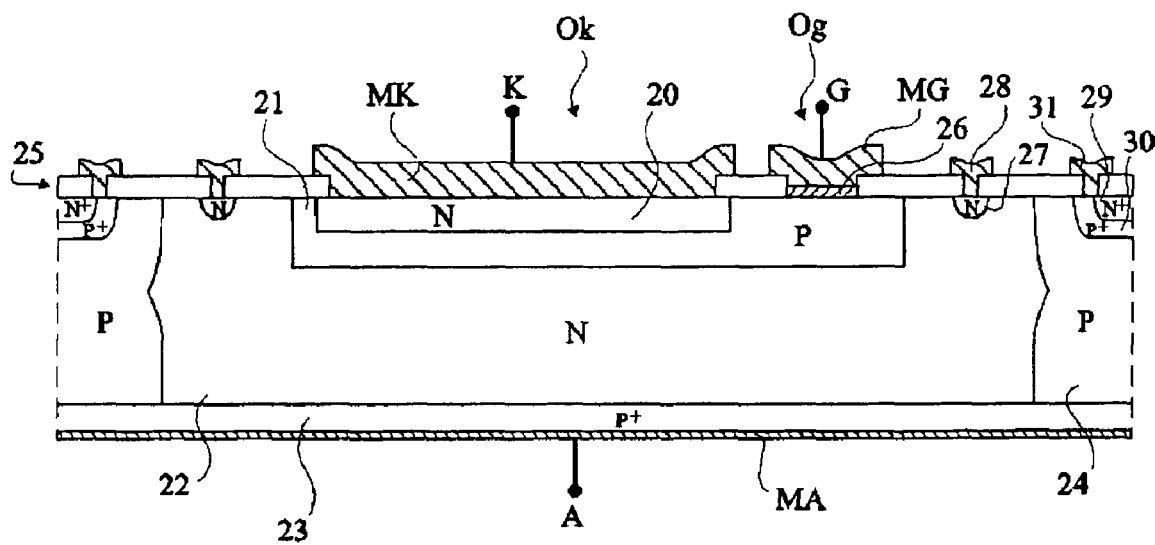
FIG. 2 is a cross-section view of a thyristor.

FIG. 2 is a cross-section view of an embodiment of a thyristor integrating capacitor Cg such as described in the above-mentioned patent application. The thyristor comprises an N-type cathode region 20, formed in a P-type well 21, itself formed in a lightly-doped N-type substrate 22, and a P-type anode region 23 on the rear surface side of the thyristor. Substrate 22 is surrounded with a P-type doped insulating wall 24. P-type well 21 corresponds to a gate area. The front surface of the thyristor is covered with an insulating layer 25 in which are provided several openings, among which two openings Ok and Og respectively above cathode region 20 and above a portion of P-type well 21. A cathode metallization MK connected to a cathode terminal K is in contact with cathode region 20 in opening Ok. The rear surface of the component is coated with an anode metallization MA connected to an anode terminal A. An insulating layer 26 is placed in opening Og to cover a portion of well 21. Insulating layer 26 is covered with a gate metallization Mg connected to a gate terminal G. The gate area of the thyristor is thus accessible via a capacitor having insulating layer 26 as a dielectric, the electrodes corresponding to metallization Mg and to P well 21. As described in the above-mentioned patent application, capacitor Cg is not necessarily arranged above the cathode gate region.

A planar thyristor such as shown in FIG. 2 currently comprises, on its front surface side, a heavily-doped N-type ring-shaped area 27, called the channel-stop area, preferably covered with a metallization 28 placed in an opening of insulating layer 25. Further, a heavily-doped N-type region 29 is currently formed in a heavily-doped P-type well 30 placed at the surface of insulating wall 24. Well 30 is covered with a metallization 31 placed in an opening of insulating layer 25.

In the diagram of FIG. 1, the cathode of thyristor 2 is connected to a terminal of the power circuit which is used as a reference for the control circuit. In the case where the control circuit is desired to have a reference voltage independent from the power circuit, an insulation must be provided between the two circuits.

The present invention provides, in the case of a high-frequency control, ensuring this insulation by inserting a capacitor Ck shown in dotted lines in FIG. 1 between the reference voltages of the control and power circuits. The association of a control circuit generating a high-frequency control signal and of isolation capacitors on the gate and the cathode of thyristor 2 enables forming, in a simple fashion, a galvanic isolation between the control circuit and the thyristor.

The present invention further provides a thyristor structure integrating capacitors Cg and Ck.

Figure 3:
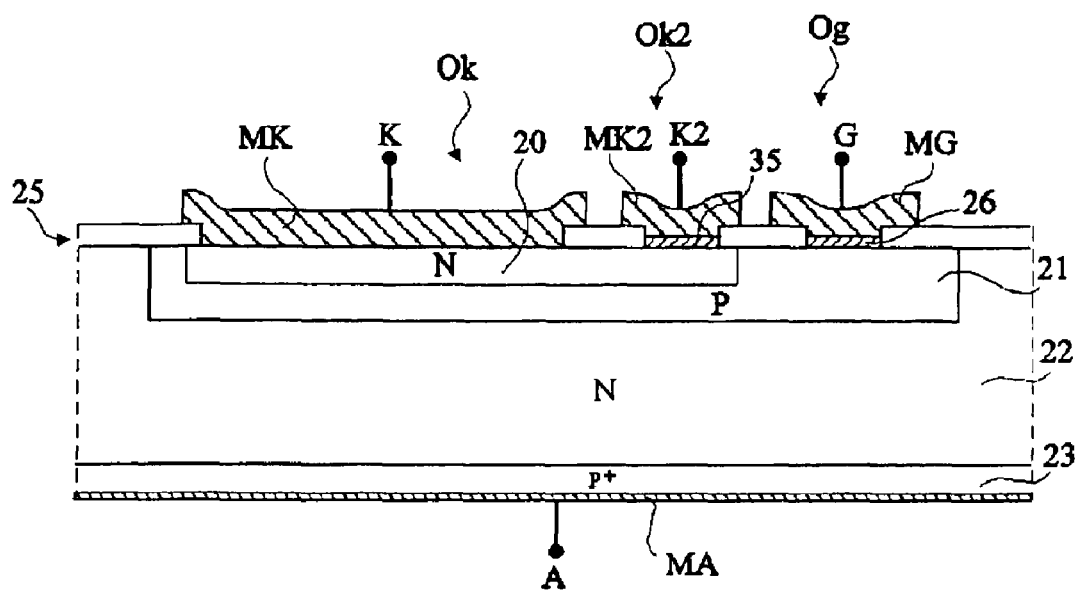
FIG. 3 is a cross-section view of a thyristor according to an embodiment of the present invention.

FIG. 3 is a cross-section view of an embodiment of a thyristor according to the present invention integrating capacitors Cg and Ck. The assembly of the semiconductor areas and of the metallizations of the thyristor is similar to that of the thyristor shown in FIG. 2. Similar elements are designated with same reference numerals and will not be described again. The essential difference is that a second opening Ok2 distinct from opening Ok is formed in insulating layer 25 above cathode region 20. Opening Ok2 has a much smaller surface area than openings Ok and is formed close to opening Og. A metallization MK connected to a cathode terminal K is placed in opening Ok and forms, as previously, the cathode of the thyristor power circuit. An insulating layer 35 placed in opening Ok2 covers a small portion of cathode region 20. A metallization MK2 connected to an auxiliary cathode terminal K2 covers insulating layer 35. The thyristor thus comprises two cathode terminals. The first terminal of main terminal K is in contact with the cathode region and forms the cathode of the thyristor power circuit. The second terminal or auxiliary terminal K2 is connected to the cathode region via a capacitor Ck having insulating layer 35 as a dielectric. Auxiliary terminal K2 forms a gate reference terminal. The application of a high-frequency signal between gate terminal G and gate reference terminal K2 enables activating the thyristor. Further, the high-frequency signal generator is insulated from the active portion of the thyristor by means of insulating layers 26 and 35.

Figure 4:
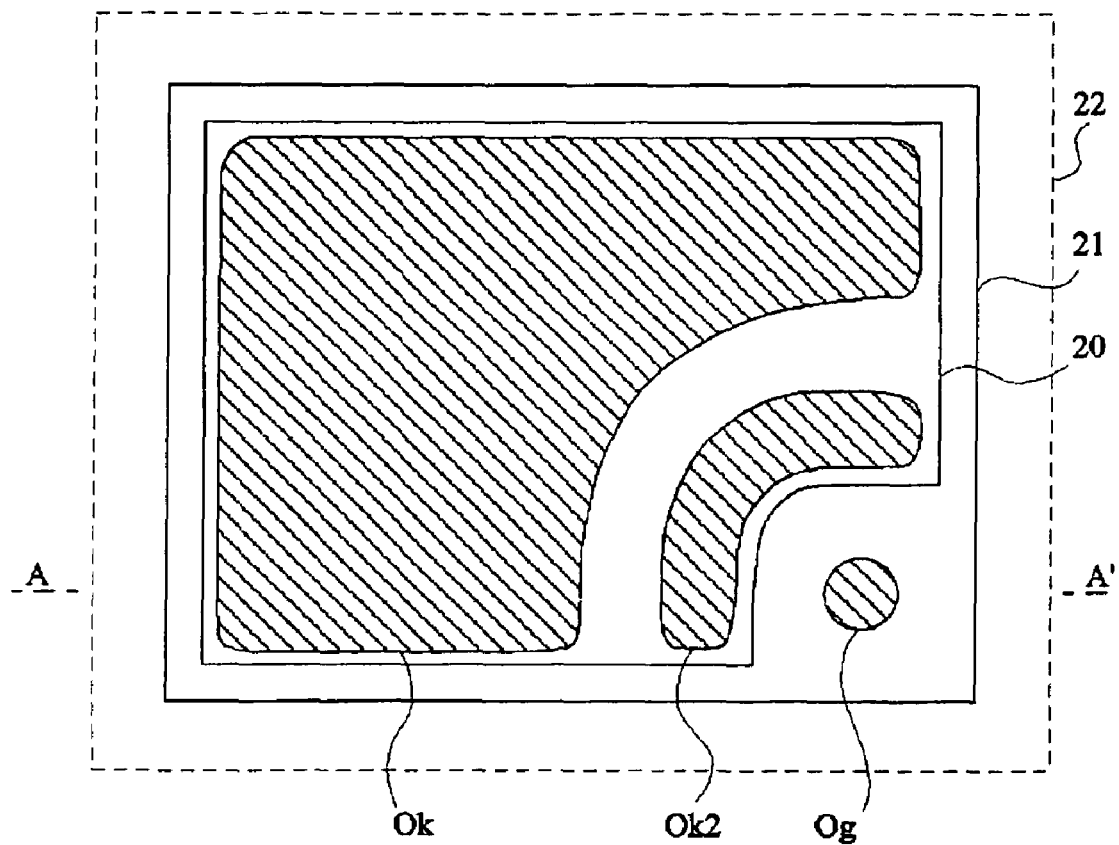
FIG. 4 is an example of a top view of the thyristor of FIG. 3.

FIG. 4 is an example of a top view of the thyristor of FIG. 3 without the metallizations. The peripheries of P well 21 and of N layer 22 are substantially rectangular but could be circular or have any other shape. N region 20 has the shape of a rectangle from which a corner is missing. Opening Og represented by a circle is placed in the "missing" corner of N region 20 above well 21. Opening Ok2 has a banana shape around the missing corner close to opening Og. Opening Ok exposes the majority of N region 20 non exposed by opening Ok2. The cross-section view of FIG. 3 is made at the level of plane AA' shown in FIG. 4.

Figure 5:
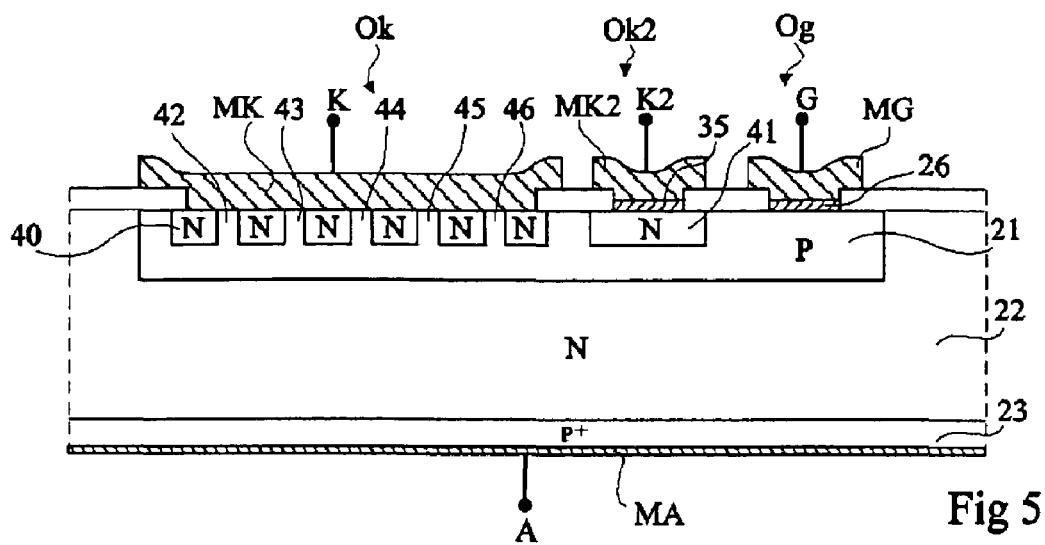
FIG. 5 is a cross-section view of a thyristor according to another embodiment of the present invention.

FIG. 5 is a cross-section view of a thyristor according to an alternative embodiment of the present invention. The shown thyristor is identical to that of FIG. 3 except that N-type cathode region 20 formed in P well 21 is replaced with two N regions 40 and 41. N region 40 is formed under opening Ok and N region 41 is formed under opening Ok2. N region 40 preferably comprises emitter short-circuit holes corresponding to portions 42 to 46 of P well 21.

Figure 6:
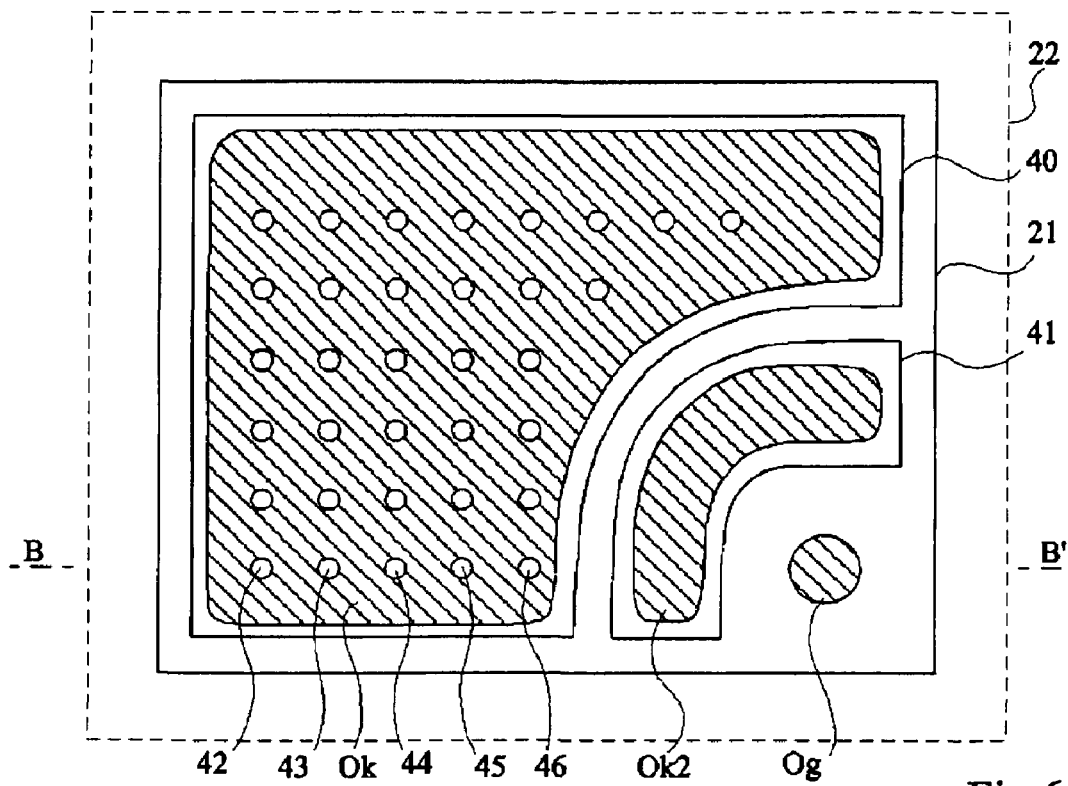
FIG. 6 is an example of a top view of the thyristor of FIG. 5.

FIG. 6 is an example of a top view of the thyristor of FIG. 5. This top view is substantially identical to that of FIG. 4 except that N cathode region 20 is replaced with two N regions 40 and 41. The cross-section view of FIG. 5 is made at the level of plane BB' of FIG. 6.

An advantage of the embodiment of FIGS. 5 and 6 is that it enables optimizing both the triggering responsiveness of the thyristor and its dV/dt break-over characteristics (break-over caused by an abrupt variation of the voltage between the main terminals). Indeed, N region 41, P well 21, N region 22, and region 23 can be considered as forming a highly responsive "auxiliary" thyristor since N cathode region 41 is placed close to gate opening Og and no short-circuit hole is provided in this cathode region. However, N region 40, P well 21, N layer 22, and region 23 form a main thyristor, the dV/dt strength is good due to the presence of emitter holes. The triggering of this main thyristor is caused by turning-on the auxiliary thyristor.

Figure 7:
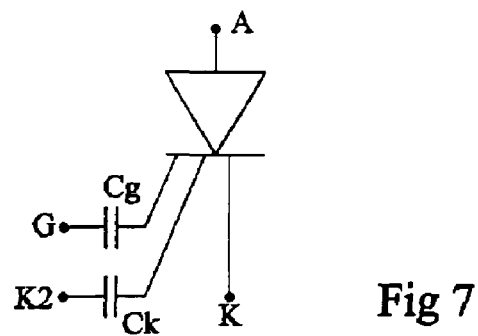
FIG. 7 shows an equivalent circuit diagram of a thyristor according to the present invention.

FIG. 7 is a simplified representation of a thyristor according to the present invention. Gate terminal G provides access to the gate area via a capacitor. Similarly, a main cathode terminal K provides direct access to the cathode area of the thyristor. An auxiliary cathode terminal K2, or gate reference terminal, provides access to the cathode area of the thyristor via a capacitor. As for terminal A, it provides direct access to the anode area of the thyristor.

Figure 8:
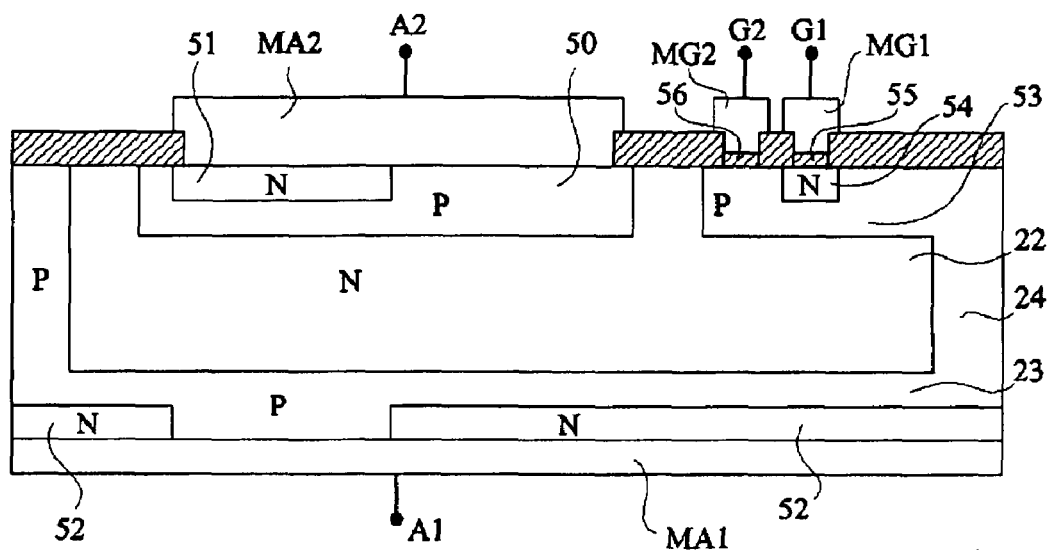
FIG. 8 is a cross-section view of a bi-directional switch controlled according to an embodiment of the present invention.

FIG. 8 is a cross-section view of a bi-directional switch controlled according to an embodiment of the present invention. This bi-directional switch is formed from a lightly-doped N-type substrate 22 comprising on its rear surface side a P-type layer 23 and surrounded with a P-type wall 24. On the front surface side is exposed a P-type well 50 in which is formed an N-type region 51, forming the two main front surface areas of the switch. On the rear surface side, an N-type region 52 is formed everywhere except opposite to N-type region 51. Two components of thyristor type in antiparallel, respectively formed of regions 51-50-22-23 and 50-22-23-52, are thus available. The triggering area is formed in an inward extension 53 of insulating wall 24. In extension 53 is formed an N-type region 54. Above N-type region 54 is formed a metallization MG1 connected to a gate terminal G1 and above a portion of region 53 is formed a metallization MG2 connected to a gate terminal G2. Metallizations MG1 and MG2 are insulated from the underlying semiconductor regions by insulating layers 55 and 56. Such a component triggers when a high-frequency voltage is applied between terminals G1 and G2.

Figure 9:
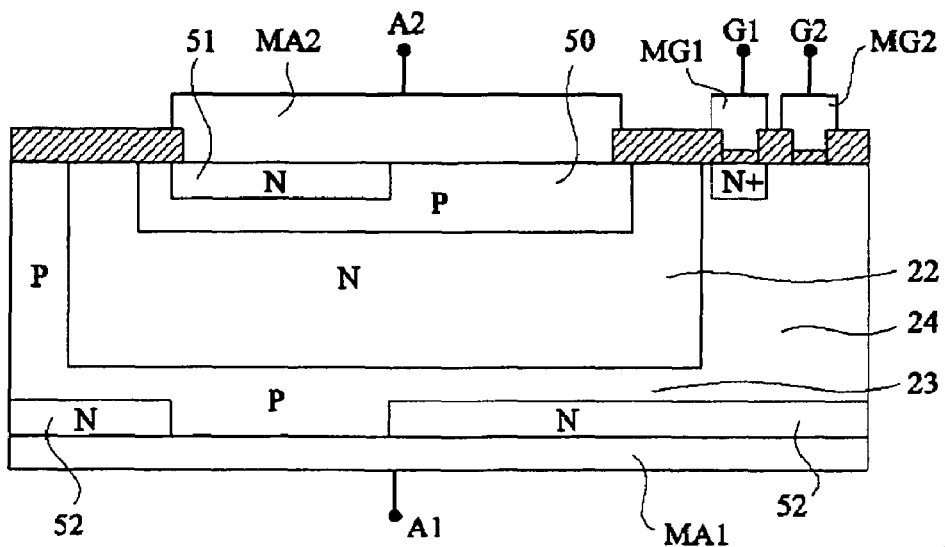
FIG. 9 is a cross-section view of an alternative bi-directional switch controlled according to an embodiment of the present invention.

FIG. 9 is a cross-section view forming variation of the controlled bi-directional switch of FIG. 8. In the case of FIG. 9, instead for the regions connected to terminals G1 and G2 to be formed in an inward extension of insulating wall 24, they are formed directly in an upper portion of this insulating wall.

Figure 10:
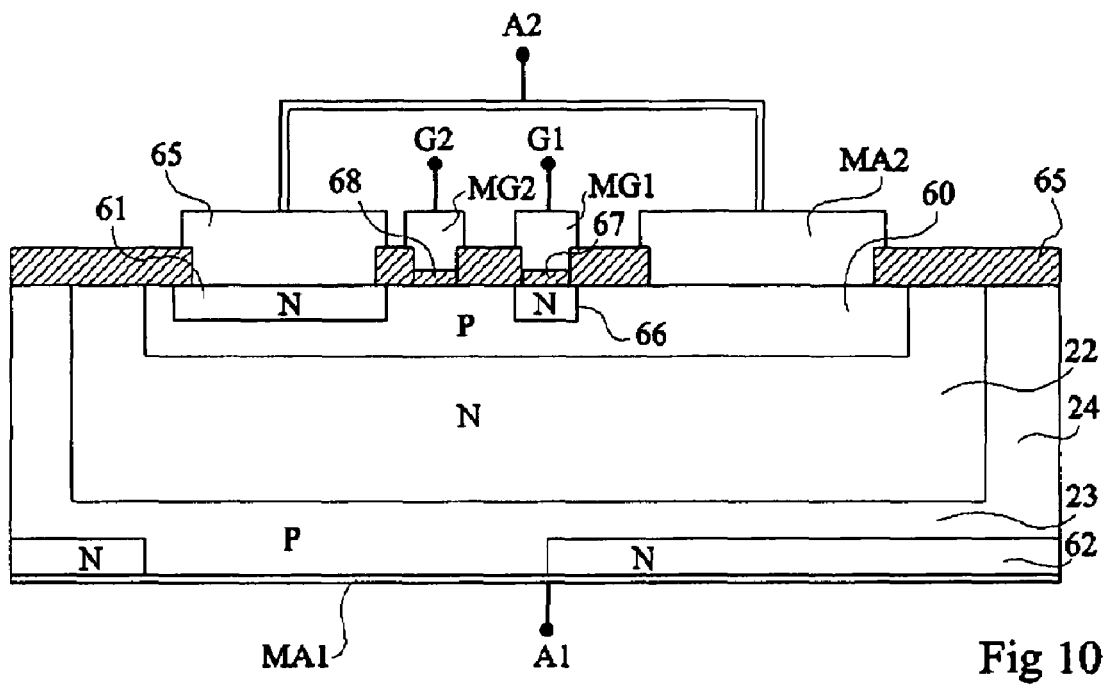
FIG. 10 is a cross-section view of a triac according to an embodiment of the present invention.

FIG. 10 shows an embodiment of a triac according to the present invention. This triac is formed from a lightly-doped N-type substrate 22 having its rear surface coated with a P-type layer 23 and surrounded with a P-type insulating wall 24. As in the previous embodiment, this insulating wall may be the limit of the component or be a limit between this component and another component formed in the same substrate. On the front surface side is formed a P-type well 60 in which is formed a main N-type region 61.

Figure 11:
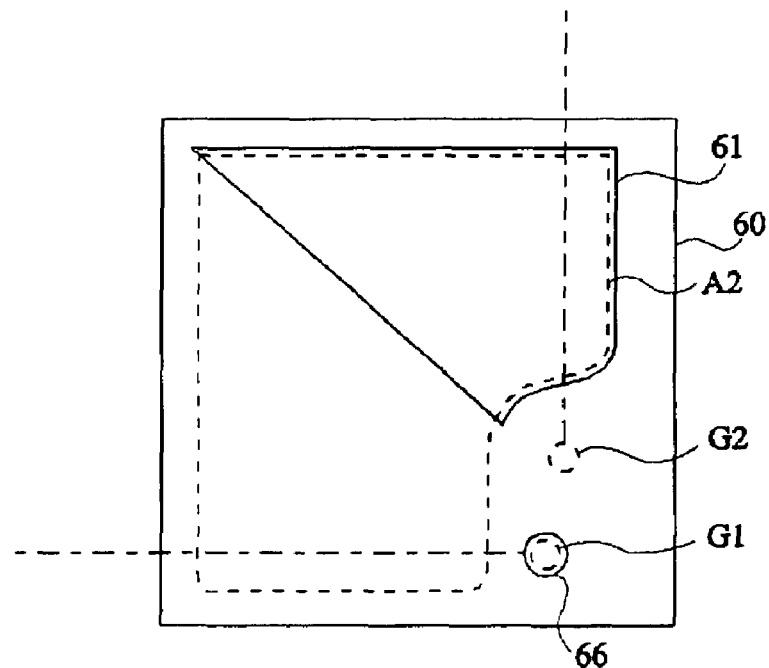
FIG. 11 is an example of a top view of the triac of FIG. 10.

An example of shape of these regions appears in the top view of FIG. 11. On the rear surface side, an N-type layer 62 is formed substantially everywhere except opposite to N-type region 61 on the upper surface side. A metallization MA1 connected to a main terminal A1 covers the rear surface and a metallization MA2, in contact with region 61 and well 60, is formed in an opening of an insulating layer 65, this opening being designated as A2 in FIG. 11. Above a portion of well 60 is formed a triggering region. This region is shown as being central in the cross-section view of FIG. 10 and as being lateral in the top view of FIG. 11. The triggering region comprises an N-type region 66 above which is formed a metallization MG2, with an interposed insulating layer 67 to form a capacitor between metallization MG2 and region 66. Further, a metallization MG1 is formed above a portion of well 60 with an interposed insulating region 68. In the top view of FIG. 11, the corresponding openings are designated with regions in dotted lines G1 and G2.

Figure 12:
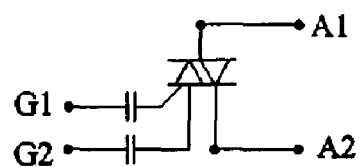
FIG. 12 shows an equivalent circuit diagram of a triac according to the present invention.

FIG. 12 is an equivalent diagram of the circuit.

Due to the high-frequency control, the bi-directional switches illustrated in FIGS. 8 to 11 can be started whatever the biasing of the voltage applied between main terminals A1 and A2.

Generally, the present invention applies to any type of SCR switch comprising at least four semiconductor layers of alternate doping type through which a large current is capable of flowing from a surface to another between two main terminals and comprising a gate terminal connected to a gate area. A switch according to the present invention further comprises a gate reference terminal connected to a gate reference area. Each of the gate and gate reference terminals is connected to a respective area of the switch via an integrated capacitor. The switch can be activated by the application of a high-frequency signal between the gate and gate reference terminals. The control circuit is thus not connected for a D.C. current to a terminal of the power circuit. This has the advantage that it is always possible, if desired, to ground the rear surface of the component, which simplifies the radiator assembly.

Of course, the present invention is likely to have various alterations, modifications, and improvements which will readily occur to those skilled in the art. In particular, the areas of a switch may be connected to terminals via a capacitor formed above the switch. The capacitors may, for example, be formed of two metal electrodes, one of the electrodes being connected to an area of the switch by a conductive contact, the other electrode being connected to a terminal of the switch by another contact.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A vertical SCR switch capable of being controlled by a high-frequency signal, comprising at least four main layers of alternated doping types through which a large current is capable of circulating from one surface to another between two main terminals, and comprising:
   a gate area connected to a gate terminal via a first integrated capacitor; and
   a gate reference area connected to a gate reference terminal via a second integrated capacitors, the gate reference area being arranged on the same surface of the switch as the gate area, the gate terminal and the gate reference terminal being different from the main terminals and being adapted to receive said high-frequency signal.

2. The switch of claim 1, of thyristor type, comprising on the front surface side a main semiconductor area of a first doping type formed in a gate semiconductor area of a second doping type, a first portion of the main area being connected to one of the main terminals, a second portion of the main area being connected to the gate reference terminal via the second integrated capacitor, and a third portion of the gate area being connected to the gate terminal via the first integrated capacitor.

3. The switch of claim 2, wherein the first and second portions of the main area are two separate semiconductor regions.

4. The switch of claim 2, wherein the second portion of the main area and said third portion of the gate area are each covered with an insulating layer and with a metallization, and wherein stacking of the second portion of the main area, of a first insulating portion, and of a first metallization forms the second integrated capacitor and stacking of the third portion of the gate area, of a second insulating layer, and of a second metallization forms the first integrated capacitor.

5. The switch of claim 2, wherein the second portion of the main area is covered with a first metallization, the first metallization being connected to the gate reference terminal, and the third portion of the gate area is covered with a second metallization, the second metallization being connected to the gate terminal.

6. The switch of claim 2, wherein the main area is a cathode area, the main area comprising one or several N-type semiconductor regions formed in a P-type well forming the gate area, the P-type well being formed above an N-type semiconductor layer under which is placed a P-type semiconductor region corresponding to a thyristor's anode.

7. The switch of claim 6, wherein the second portion of the main area corresponding to an N-type region is placed between said first portion of the main area corresponding to an N-type region and the portion of the P-type well connected to the gate terminal.

8. The switch of claim 6, wherein the first portion of the main area comprises several holes corresponding to portions of the P-type well, a metallization connected to a main terminal covering the first portion of the main area and all the holes.

9. The switch of claim 1 of triac type, comprising on the front surface side a main semiconductor area of a first doping type formed in a well of a second doping type, the main area and the well being connected to a main terminal, a gate region of the first doping type being formed in the well and being connected to a control terminal via a first integrated capacitor, and a portion of the well being connected to a gate reference terminal via a second integrated capacitor.

10. The switch of claim 1 of bi-directional type, comprising on the front surface side a main semiconductor area of a first doping type formed in a well of a second doping type, the main area and the well being connected to a main terminal, the assembly being surrounded with an insulating wall, a gate region of the first doping type being formed in the insulating wall or in a lateral prolongation thereof and being connected to a control terminal via a first integrated capacitor, and a portion of the well being connected to a gate reference terminal via a second integrated capacitor.

11. A thyristor being controlled by a high-frequency signal, comprising at least four main layers of alternated doping types through which a large current is capable of circulating from one surface to another between two main terminals, and comprising:
 a first integrated capacitor that couples a first gate terminal to a gate area of the thyristor; and
 a second integrated capacitor that couples a second gate terminal to a cathode area of the thyristor, wherein the cathode area being arranged on the same surface of the thyristor as the gate area and the first gate terminal and the second gate terminal being different from the main terminals and being adapted to receive the high-frequency signal.

12. The thyristor of claim 11, wherein the first integrated capacitor is formed by stacking the gate area, a first insulating layer, and a first metallization, and the second integrated capacitor is formed by stacking the cathode area, a second insulating layer, and a second metallization.

13. The thyristor of claim 12, wherein the first gate terminal is connected to the first metallization and the second gate terminal is connected to the second metallization.

14. The thyristor of claim 12, wherein the gate area is covered by the first metallization and the cathode area is covered by the first metallization.

15. A thyristor being controlled by a high-frequency signal, comprising at least four main layers of alternated doping types through which a large current is capable of circulating from one surface to another between two main terminals, and comprising:
 a first gate terminal capacitively coupled to a gate area of the thyristor via a first integrated capacitor; and
 a second gate terminal capacitively coupled to a cathode area of the thyristor via a second integrated capacitor.

16. The thyristor of claim 15, wherein the first integrated capacitor is formed by stacking the gate area, a first insulating layer, and a first metallization, and the second integrated capacitor is formed by stacking the cathode area, a second insulating layer, and a second metallization.

17. The thyristor of claim 16, wherein the first gate terminal is connected to the first metallization and the second gate terminal is connected to the second metallization.

18. The thyristor of claim 16, wherein the gate area is covered by the first metallization and the cathode area is covered by the first metallization.

* * * * *

UNITED STATES PATENT AND TRADEMARK OFFICE
CERTIFICATE OF CORRECTION

PATENT NO. : 7,259,407 B2
APPLICATION NO. : 10/963383
DATED : August 21, 2007
INVENTOR(S) : Samuel Menard et al.

It is certified that error appears in the above-identified patent and that said Letters Patent is hereby corrected as shown below:

Claim 1, col. 6, line 50 should read:
minal via a second integrated capacitor, the gate Signed and Sealed this Sixth Day of November, 2007

JON W. DUDAS
*Director of the United States Patent and Trademark Office*